(12) United States Patent
Lee et al.

(10) Patent No.: US 8,411,479 B2
(45) Date of Patent: Apr. 2, 2013

(54) MEMORY CIRCUITS, SYSTEMS, AND METHODS FOR ROUTING THE MEMORY CIRCUITS

(75) Inventors: Cheng Hung Lee, Hsinchu (TW); Jui-Che Tsai, Tainan (TW); Ching-Wei Wu, Caotun Town (TW); Kuang Ting Chen, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 145 days.

(21) Appl. No.: 12/835,041

(22) Filed: Jul. 13, 2010

(65) Prior Publication Data

US 2011/0019458 A1    Jan. 27, 2011

Related U.S. Application Data

(60) Provisional application No. 61/227,994, filed on Jul. 23, 2009.

(51) Int. Cl.
*G11C 5/08* (2006.01)

(52) U.S. Cl. .................. 365/69; 365/63; 365/230.05

(58) Field of Classification Search ................ 365/63 X, 365/69 O, 154, 230.05 X, 63, 69, 230.05
See application file for complete search history.

(56) References Cited

U.S. PATENT DOCUMENTS

| | | | | |
|---|---|---|---|---|
| 4,733,374 A | * | 3/1988 | Furuyama et al. | 365/205 |
| 5,155,700 A | * | 10/1992 | Min et al. | 365/63 |
| 7,405,994 B2 | * | 7/2008 | Liaw | 365/230.05 |
| 7,804,700 B2 | * | 9/2010 | Yamada et al. | 365/69 |

* cited by examiner

*Primary Examiner* — VanThu Nguyen
(74) *Attorney, Agent, or Firm* — Lowe Hauptman Ham & Berner, LLP (57) ABSTRACT

A memory circuit includes a first memory array. The first memory array includes at least one first memory cell for storing a first datum. The at least one first memory cell is coupled with a first word line and a second word line. A second memory array is coupled with the first memory array. The second memory array includes at least one second memory cell for storing a second datum. The at least one second memory cell is coupled with a third word line and a fourth word line. The first word line is coupled with the third word line. The first word line is misaligned from the third word line in a routing direction of the first word line in the first memory array.

18 Claims, 14 Drawing Sheets

MEMORY CIRCUITS, SYSTEMS, AND METHODS FOR ROUTING THE MEMORY CIRCUITS

CROSS-REFERENCE TO RELATED APPLICATIONS

The present application claims priority of U.S. Provisional Patent Application Ser. No. 61/227,994, filed on Jul. 23, 2009 which is incorporated herein by reference in its entirety.

TECHNICAL FIELD

The present disclosure relates generally to the field of semiconductor circuits, and more particularly, to memory circuits, systems, and method for routing word lines of the memory circuits.

BACKGROUND

Memory circuits have been used in various applications. Conventionally, memory circuits can include DRAM, SRAM, and non-volatile memory circuits. A SRAM circuit includes a plurality of memory cells. For a conventional 6-T static memory in which arrays of memory cells are provided, each of the memory cells consists of six transistors. The 6-T SRAM memory cell is coupled with a bit line BL, a bit line bar BLB, and a word line. Four of the six transistors form two cross-coupled inverters for storing a datum representing "0" or "1". The remaining two transistors serve as access transistors to control the access of the datum stored within the memory cell.

One variation of SRAM designs is a dual-port SRAM structure. The dual-port SRAM structure has speed advantages because it can simultaneously sustain two read operations, two write operations, or one read operation and one write operation.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Conventionally, a dual-port SRAM cell has two inverters. Each of the inverters is composed of a P-channel MOS transistor in series with an input/output (I/O) node and an N-channel MOS transistor. The node of each inverter is connected to the gates of both transistors of the other inverter. A first I/O transistor and a second I/O transistor are individually connected from a first bit line and a second bit line to the node of one of the inverters. A third I/O transistor and a fourth I/O transistor are individually connected from a first bit line bar and a second bit line bar (always biased oppositely from the corresponding bit line) to the node of the other one of the inverters.

Conventionally, a single row of dual-port SRAM cells can have two word lines. A first word line is coupled with gates of the first I/O transistor and the third I/O transistor of each dual-port SRAM cell. A second word line is coupled with gates of the second I/O transistor and the fourth I/O transistor of each dual-port SRAM cell. Conventionally, the word lines continuously extend in parallel through array regions and word line (WL) decoder regions.

In a memory circuit having 128 word lines, 64 rows of dual-port SRAM cells are disposed from the top to the bottom of the memory circuit. For example, a first row of dual-port SRAM cells can be disposed above and adjacent to a second row of dual-port SRAM cells. Each of the first and second rows of dual-port SRAM cells has the first and second word lines. The second word line of the first row is disposed between the first word line of the first row and the first word line of the second row. During read/write operations, an operating voltage is applied to the first word line of the first row and another operating voltage is applied to the second word line of the second row. The second word line of the first row is grounded. It is found that the operating voltages applied to the first word lines are coupled to the second word line of the first row. The voltage coupling adversely affects the operation of the memory circuit. The coupling effect becomes worse if the word lines of the rows are continuously extended in parallel through all of the array regions and the decoder regions.

Based on the foregoing, memory circuits, systems, and methods for routing word lines of the memory circuits are desired.

It is understood that the following disclosure provides many different embodiments, or examples. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or dispositions discussed.

Figure 1:
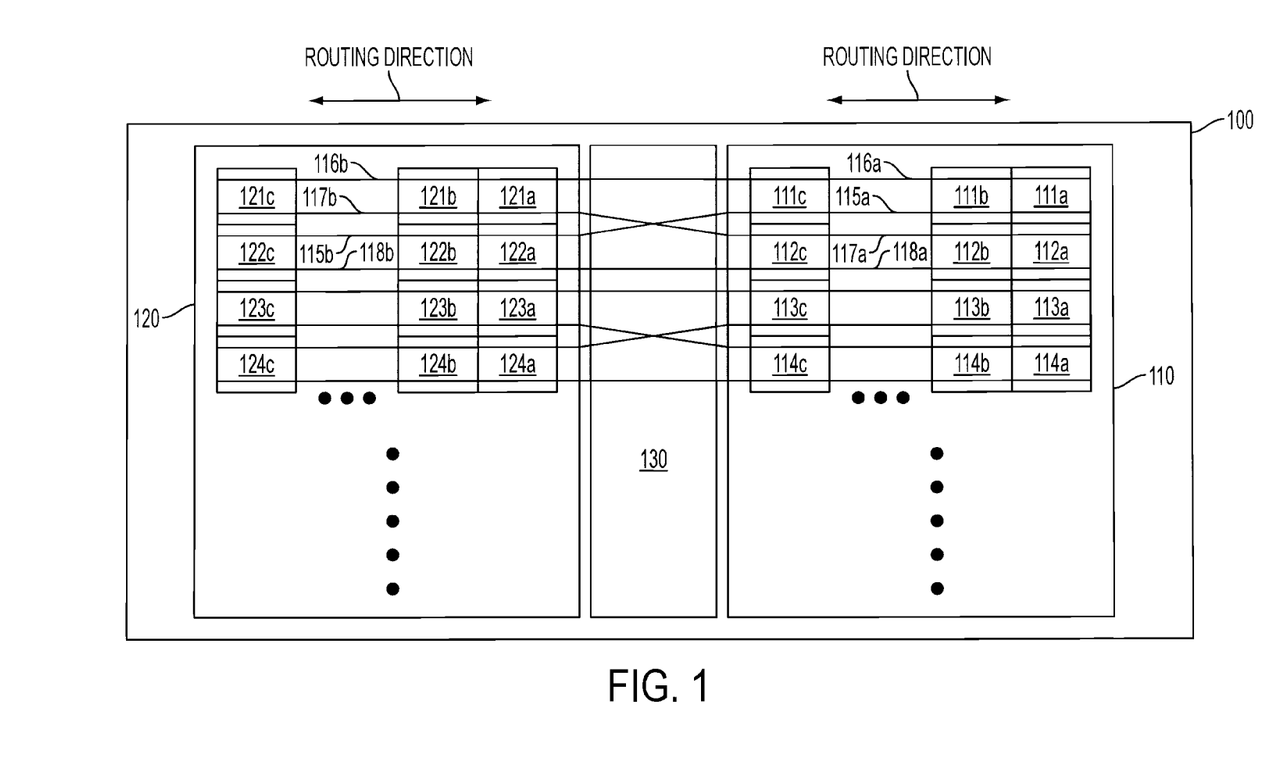
FIG. 1 is a schematic drawing illustrating an exemplary memory circuit.

FIG. 1 is a schematic drawing illustrating an exemplary memory circuit. In FIG. 1, a memory circuit 100 can include at least one memory array, e.g., memory arrays 110 and 120. Each of the memory arrays 110 and 120 can be a dual-port static random access memory (SRAM) array, an embedded dual-port SRAM array, dynamic random access memory (DRAM) array, an embedded DRAM array, a non-volatile memory array, e.g., FLASH, EPROM, E²PROME, and/or other multiple-ports memory array.

The memory array 110 can include at least one memory cell, e.g., memory cells 111a-111c, 112a-112c, 113a-113c, and 114a-114c, for storing data. Each of the memory cells 111a-111c, 112a-112c, 113a-113c, and 114a-114c can be coupled with a first word line and a second word line. For example, the memory cell 111a can be coupled with word lines 115a and 116a. The memory array 120 can be coupled with the memory array 110. The memory array 120 can include at least one memory cell, e.g., memory cells 121a-121c, 122a-122c, 123a-123c, and 124a-124c, for storing data. Each of the memory cells 121a-121c, 122a-122c, 123a-123c, and 124a-124c can be coupled with a third word line and a fourth word line. For example, the memory cell 122a can be coupled with word lines 115b and 118b. The word line 115a can be coupled with the word line 115b. The word line 115a can be substantially misaligned from the word line 115b in a routing direction of the word lines 115a in the memory array 110. In some embodiments, the word line 115a can be routed along a row of the memory cells 111a-111c of the memory array 110. The word line 115b can be routed along a row of the memory cells 122a-122c of the memory array 120. The row of the memory cells 111a-111c is misaligned from the row of the memory cells 122a-122c.

It is noted that though merely some memory cells 111a-114c and 121a-124c are depicted, other memory cells (not shown) can be coupled with the plurality of word lines of the memory circuit 100. A portion of a memory circuit 100 may have 8, 16, 32, 64, 128 or more columns that can be arranged in word widths. In some embodiments, the word lines can be laid out substantially orthogonally to bit lines (not shown). In other embodiments, other arrangements of the word lines and bit lines can be provided.

In some embodiments, the memory circuit 100 can include an area 130. The word line 115a can be coupled with the word line 115b at the area 130. The area can include a word line decoder, a word line driver, a strap area, a well-pickup area, and/or any area wherein the word line sequence is capable of being changed and/or at least one word line can jump over another word line. For example, the word line 115a is the second word line from the top of the memory array 110. The word line 115b is the third word line from the top of the memory array 120. The sequence of the word lines 115a and 115b in the memory arrays 110 and 120 can be exchanged at the area 130.

As noted, the conventional dual-port SRAM circuit has word lines continuously in parallel extending through the array regions and WL decoder region. The charged word lines can couple their voltages to the grounded word line therebetween. The voltage coupling effect can adversely affect the read and/or write operation of the conventional dual-port SRAM circuit.

In contrary to the conventional dual-port SRAM circuit, the memory circuit 100 can exchange word line sequence and/or jump the word lines in the area 130. For example, the word line 115a can be routed between the word lines 116a and 117a in the memory array 110 in FIG. 1. The word line 115b can be routed between the word lines 117b and 118b in the memory array. If voltages are applied to the word lines 116a and 117a coupled with the word lines 116b and 117b, respectively. The word line 115a is subjected to the voltage couplings from the word lines 116a and 117a in the memory array 110. In the memory array 120, the word line 115b can be merely subjected to the voltage coupling from the word line 117b. The word line 115b can be substantially from the voltage coupling from the word line 116b since the word line 116b is distant from the word line 115b. The coupling effect to the whole word lines 115a and 115b of the memory circuit 110 can be desirably reduced by, for example, 50%, compared with the conventional dual-port SRAM circuit. The read and/or write operations of the memory circuit 110 can be desirably achieved.

Figure 2A:
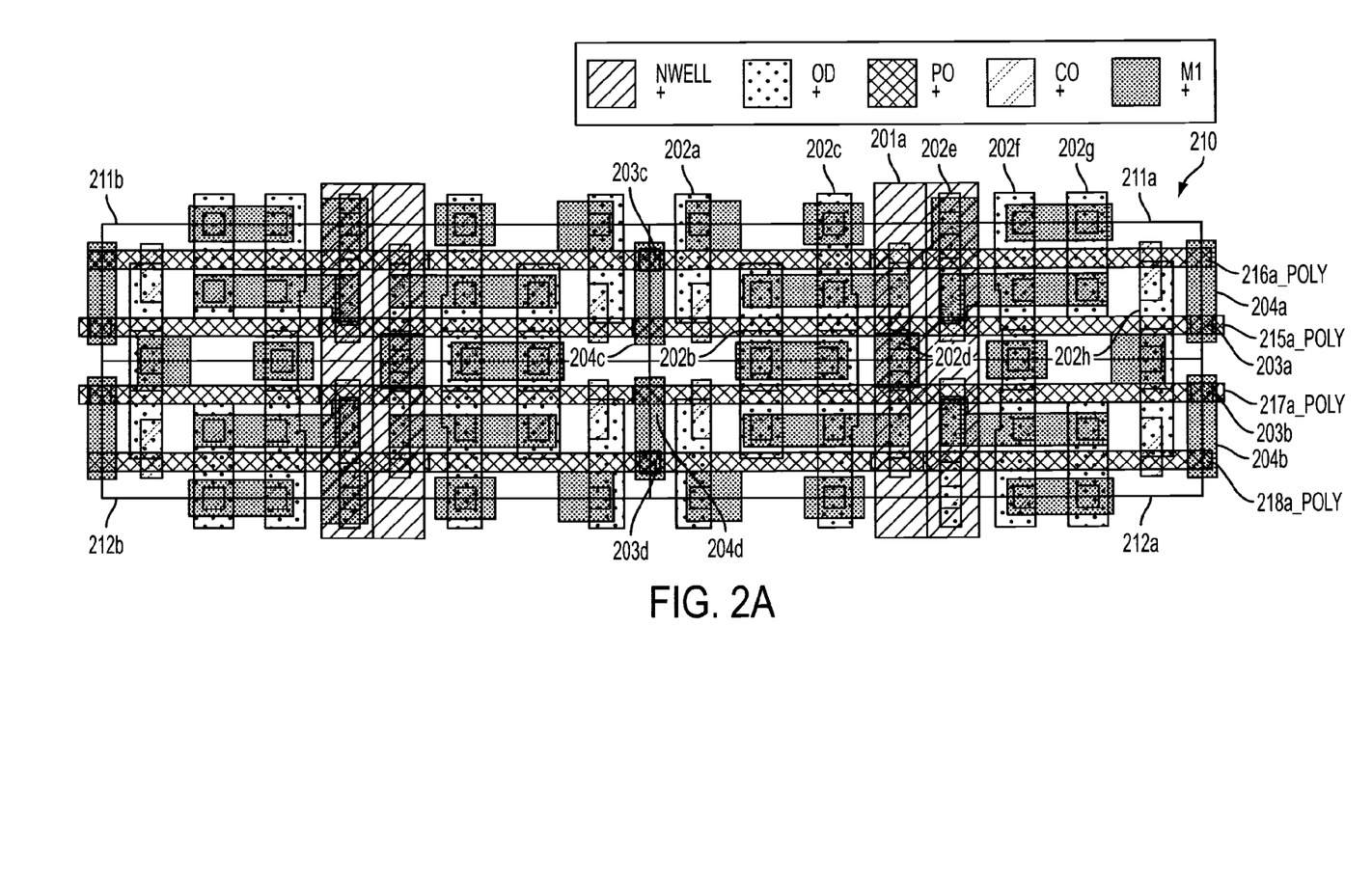
FIGS. 2A-2C are schematic drawings illustrating various layers of an exemplary memory array.
Figure 2B:
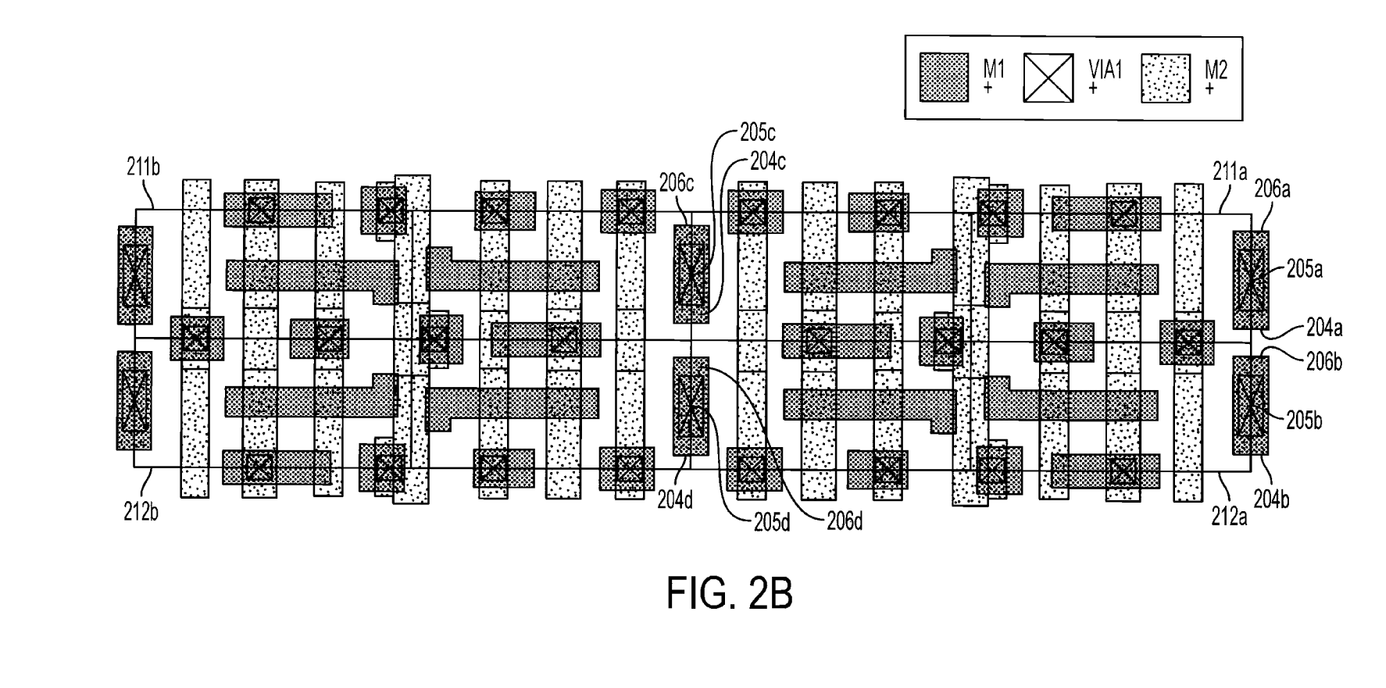
Figure 2C:
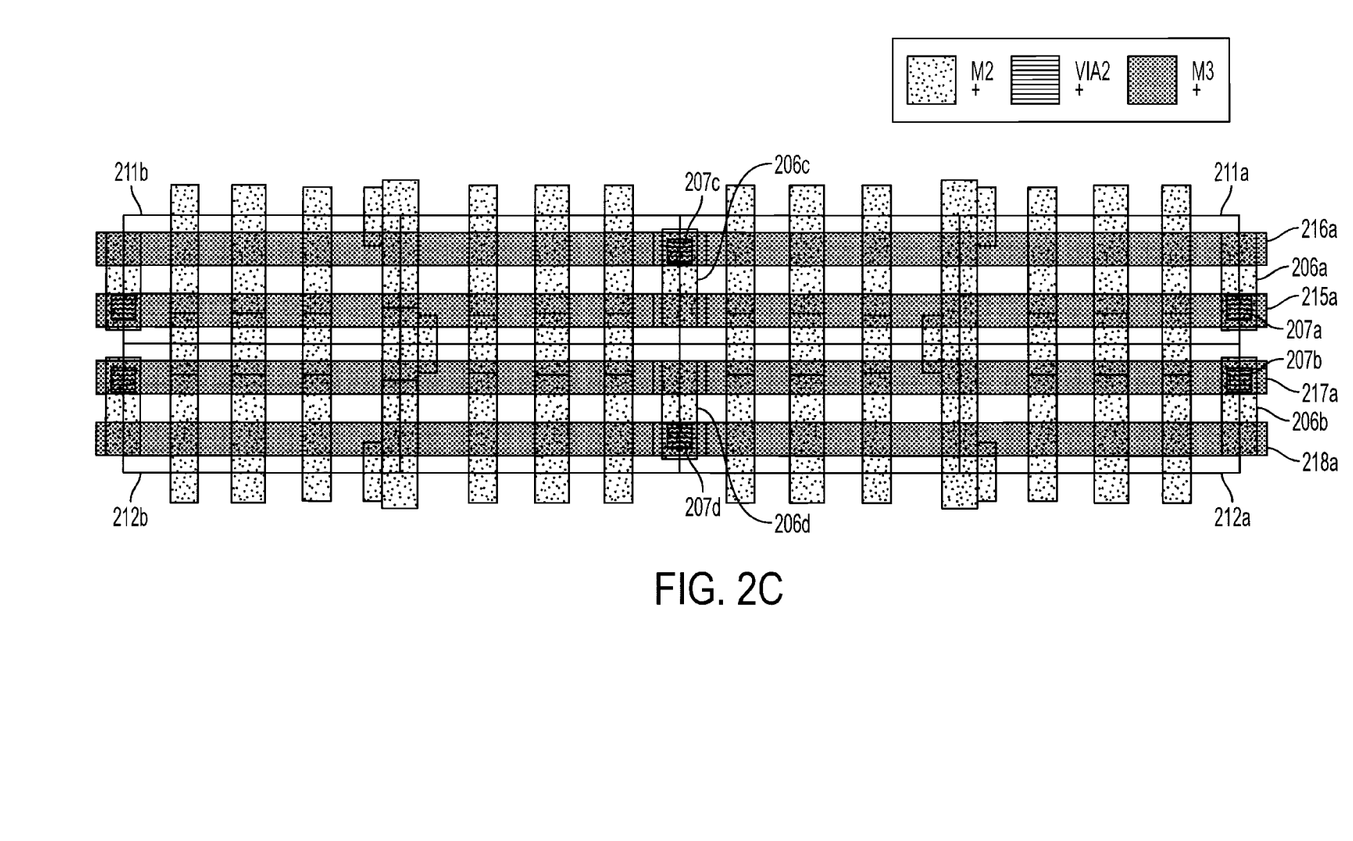

FIGS. 2A-2C are schematic drawings illustrating various layers of an exemplary memory array. FIG. 2A includes a well layer, an oxide definition (OD) layer, a poly (PO) layer, a contact (CO) layer, and a metal 1 (M1) layer of a portion of an exemplary memory circuit. In FIG. 2A, a portion of a memory array 210 can include memory cells 211a-211b and 212a-212b. Items of the memory array 210 in FIGS. 2A-2C that are the same items of the memory array 110 in FIG. 1 are indicated by the same reference numerals, increased by 100.

Referring to FIG. 2A, each of the memory cells 211a-211b and 212a-212b can include a well region 201a, e.g., an N-well region. The OD layer can include OD regions 202a-202h that can be disposed within the memory cell 211a. Portions of polysilicon lines 215a_Poly-218a_Poly can serve as gate nodes of the transistors of the memory cells 211a-221b and 212a-212b. The contact layer can include contact plugs 203a-203d. The M1 layer can include metallic regions 204a-204d. The contact plugs 203a, 203c, 203b, and 203d can couple the polysilicon lines 215a_Poly-218a_Poly with the metallic regions 204a, 204c, 204b, and 204d, respectively.

FIG. 2B includes the M1 layer, a via 1 layer, and a metal 2 (M2) layer. In FIG. 2B, the via 1 layer can include via plugs 205a-205d. The M2 layer can include metallic regions 206a-206d. In some embodiments, the M2 layer can include bit lines (not labeled) of the memory array 210. The via plugs 205a-205d can couple the metallic regions 204a-204d with the metallic regions 206a-206d, respectively.

FIG. 2C includes the M2 layer, a via 2 layer, and a metal 3 (M3) layer. In FIG. 2C, the via 2 layer can include via plugs 207a-207d. The M3 layer can include metallic lines 215a-218a. The via plugs 207a, 207c, 207b, and 207d can couple the metallic regions 206a, 206c, 206b, and 206d with the metallic lines 215a-218a, respectively. It is noted that the word line 115a-118a (shown in FIG. 1) can include the metallic lines 215a-218a and the polysilicon lines 215a_Poly-218a_Poly, respectively.

From the foregoing, the polysilicon line 215a_Poly can be coupled with the metallic line 215a through the contact plug 203a, the metallic region 204a, the via plug 205a, the metallic region 206a, and the via plug 207a. The polysilicon line 216a_Poly can be coupled with the metallic line 216a through the contact plug 203c, the metallic region 204c, the via plug 205c, the metallic region 206c, and the via plug 207c. The polysilicon line 217a_Poly can be coupled with the metallic line 217a through the contact plug 203b, the metallic region 204b, the via plug 205b, the metallic region 206b, and the via plug 207b. The polysilicon line 218a_Poly can be coupled with the metallic line 218a through the contact plug 203d, the metallic region 204d, the via plug 205d, the metallic region 206d, and the via plug 207d.

Figure 2D:
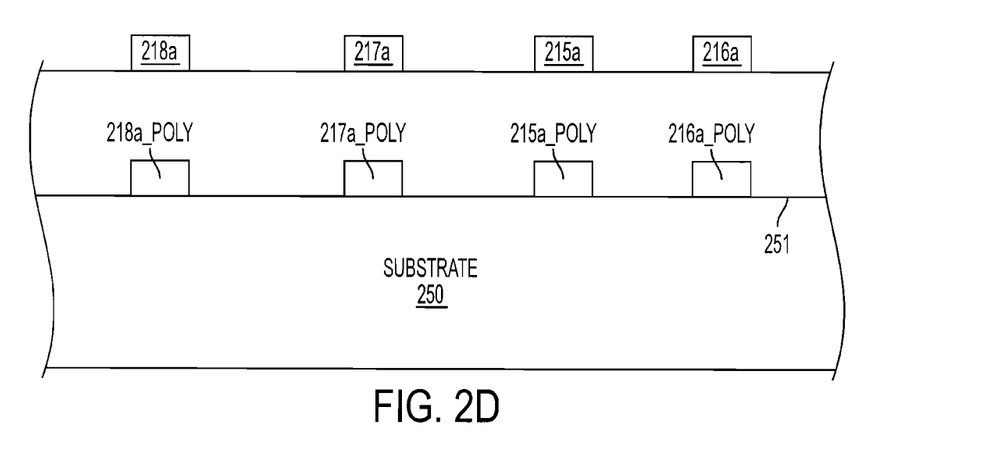
FIG. 2D is a schematic cross-sectional view of an exemplary memory array including the poly layer and the M3 layer.

FIG. 2D is a schematic cross-sectional view of an exemplary memory array including the poly layer and the M3 layer. In FIG. 2D, the polysilicon lines 215a_Poly-218a_Poly and the metallic lines 215a-218a can be disposed over a substrate 250. The metal lines 215a-218a can be substantially aligned with the polysilicon lines 215a_Poly-218a_Poly, respectively, along a direction substantially orthogonal to a surface 251 of the substrate 250.

Figure 3A:
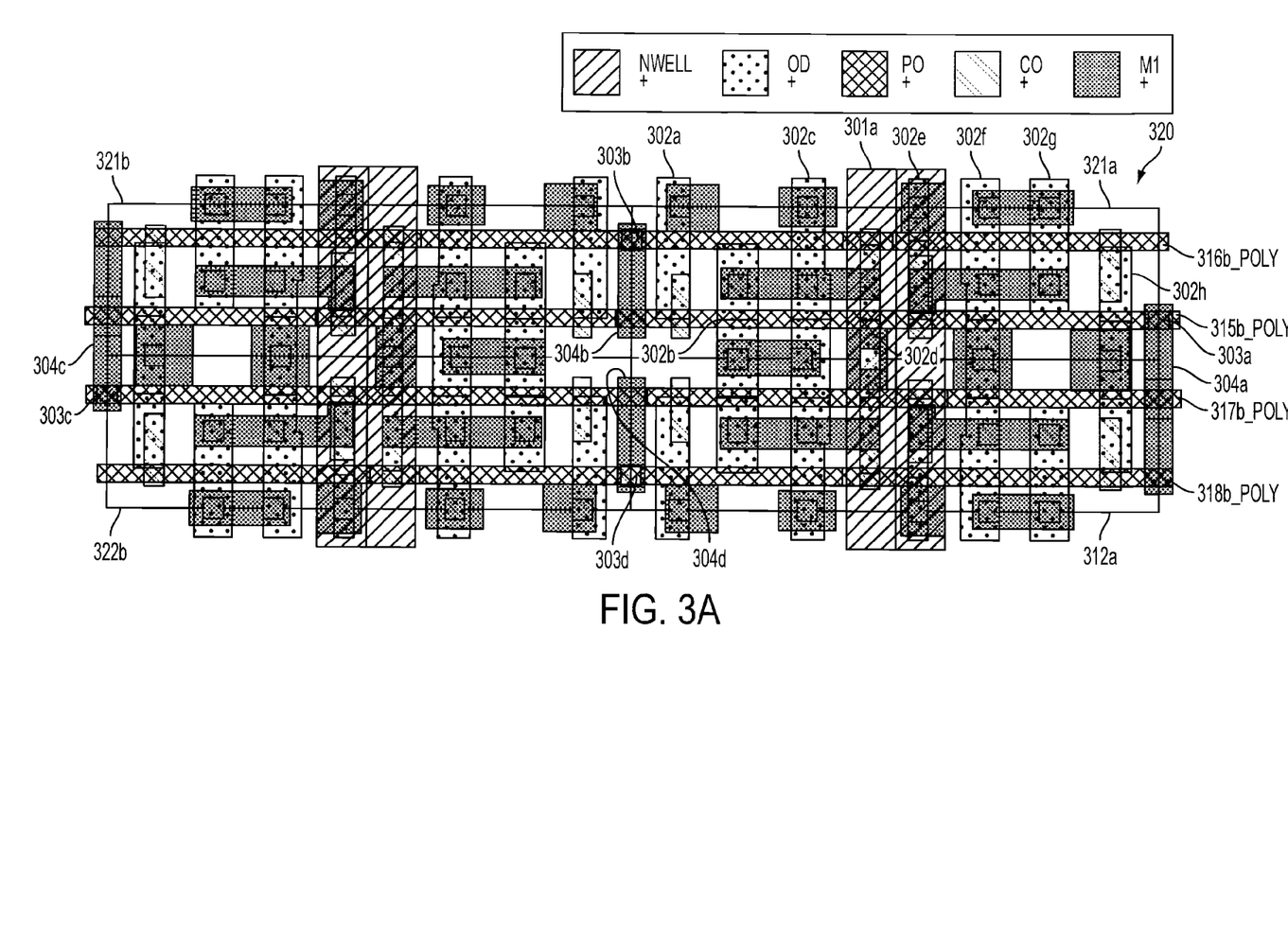
FIGS. 3A-3C are schematic drawings illustrating various layers of another exemplary memory array.
Figure 3B:
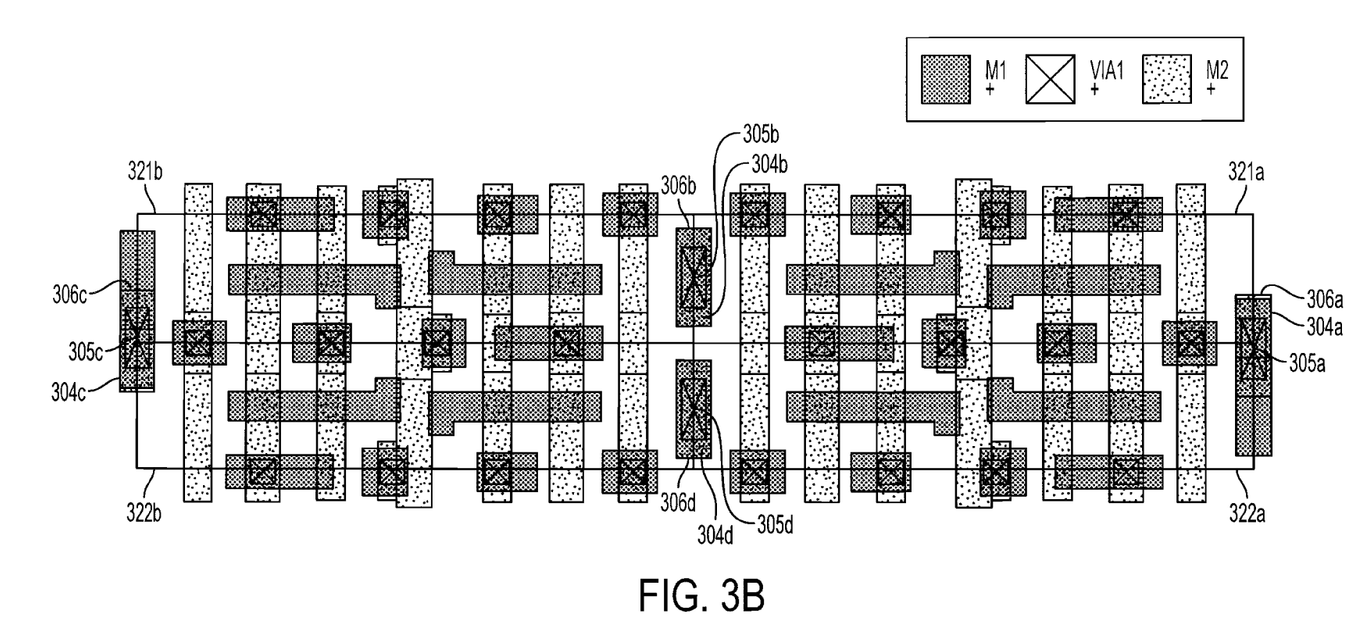
Figure 3C:
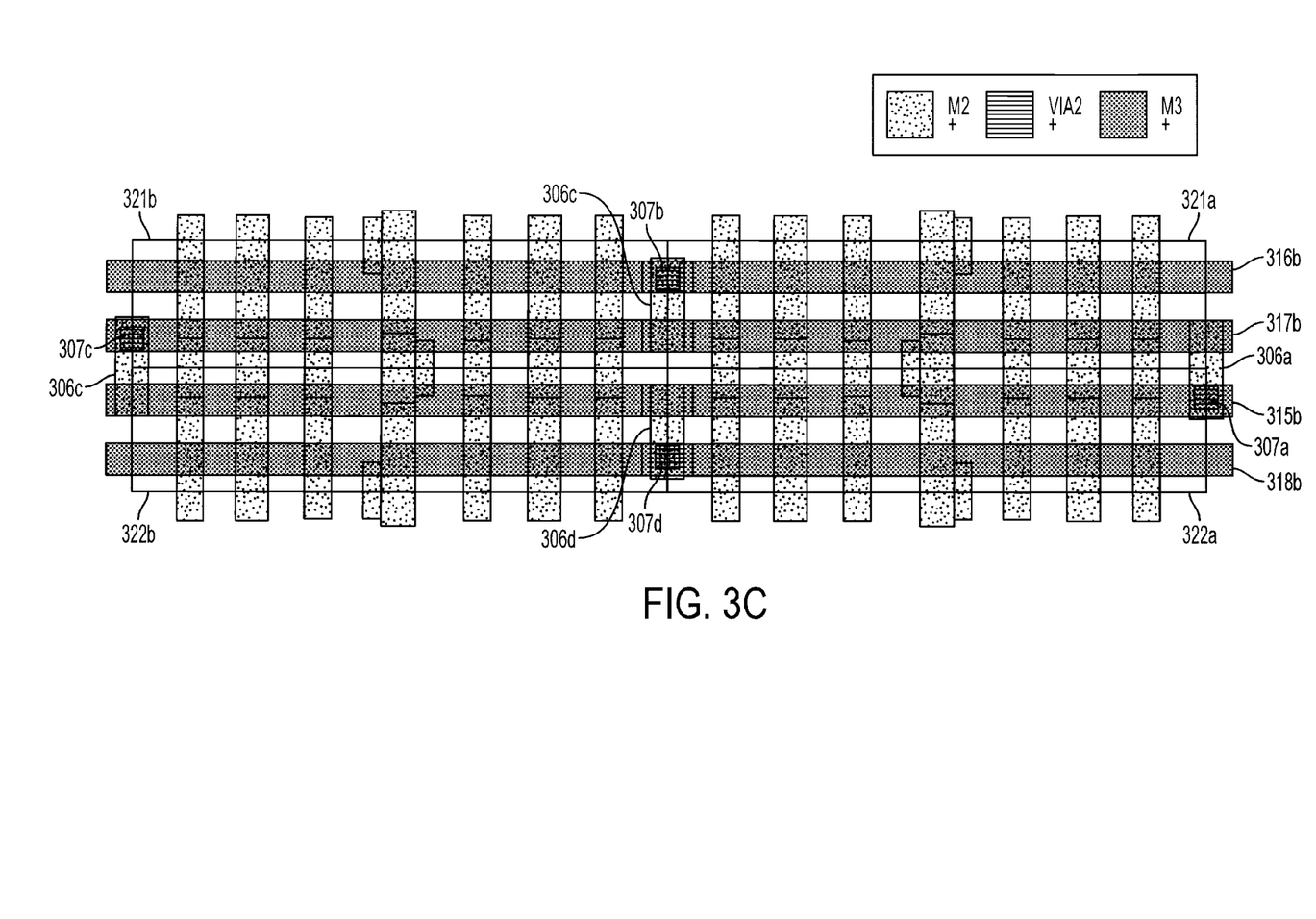

FIGS. 3A-3C are schematic drawings illustrating various layers of another exemplary memory array. FIG. 3A includes a well layer, an oxide definition (OD) layer, a poly (PO) layer, a contact (CO) layer, and a metal 1 (M1) layer of a portion of an exemplary memory circuit. The well layer, the oxide definition (OD) layer, the poly (PO) layer, the contact (CO) layer, and the metal 1 (M1) layer can be similar to those described above in conjunction with FIG. 2A. In FIG. 3A, a portion of a memory array 320 can include memory cells 321a-321b and 322a-322b. Items of the memory array 320 in FIGS. 3A-3C that are the same items of the memory array 120 in FIG. 1 are indicated by the same reference numerals, increased by 200.

Each of the memory cells 321a-321b and 322a-322b can include a well region 301a, e.g., an N-well region. The OD layer can include OD regions 302a-302h disposed within the memory cell 321a. Portions of polysilicon lines 315b_Poly-318b_Poly can serve as gate nodes of the transistors of the memory cells 321a-321b and 322a-322b. The contact layer can include contact plugs 303a-303d. The contact plugs 303a-303d can couple the polysilicon lines 315b_Poly-318b_Poly with the metallic regions 304a-304d, respectively.

FIG. 3B can include the M1 layer, a via 1 layer, and a metal 2 (M2) layer. In FIG. 3B, the via 1 layer can include via plugs 305a-305d. The M2 layer can include metallic regions 306a-306d. In some embodiments, the M2 layer can include bit lines (not labeled) of the memory array 320. The via plugs 305a-305d can couple the metallic regions 304a-304d with the metallic regions 306a-306d.

FIG. 3C includes the M2 layer, a via 2 layer, and a metal 3 (M3) layer. In FIG. 3C, the via 2 layer can include via plugs 307a-307d. The M3 layer can include metallic lines 315b-318b. The via plugs 307a-307d can couple the metallic regions 306a-306d with the metallic lines 315b-318b, respectively. It is noted that the word line 115b-118b (shown in FIG. 1) can include the metallic lines 215b-218b and the polysilicon lines 215b_Poly-218b_Poly, respectively.

From the foregoing, the polysilicon line 315b_Poly can be coupled with the metallic line 315b through the contact plug 303a, the metallic region 304a, the via plug 305a, the metallic region 306a, and the via plug 307a. The polysilicon line 316b_Poly can be coupled with the metallic line 316b through the contact plug 303b, the metallic region 304b, the via plug 305b, the metallic region 306b, and the via plug 207b. The polysilicon line 317b_Poly can be coupled with the metallic line 317b through the contact plug 303c, the metallic region 304c, the via plug 305c, the metallic region 306c, and the via plug 307c. The polysilicon line 318b_Poly can be coupled with the metallic line 318b through the contact plug 303d, the metallic region 304d, the via plug 305d, the metallic plug 306d, and the via plug 307d.

Figure 3D:
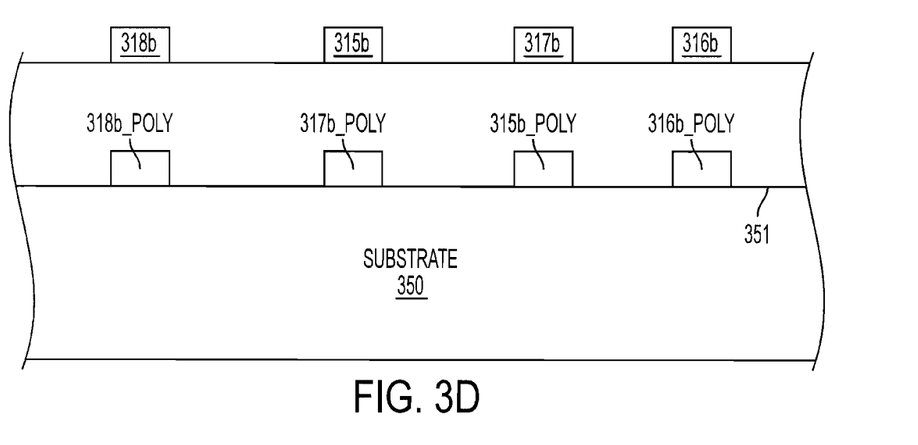
FIG. 3D is a schematic cross-sectional view of an exemplary memory array including the poly layer and the M3 layer.

FIG. 3D is a schematic cross-sectional view of an exemplary memory array including the poly layer and the M3 layer. In FIG. 3D, the polysilicon lines 315b_Poly-318b_Poly and the metallic lines 315b-318b can be disposed over a substrate 350. As noted, the polysilicon line 315b_Poly is the second polysilicon line from the top of FIG. 3A. The metallic line 315b coupled with the polysilicon line 315b_Poly is the third metallic line from the top of FIG. 3C. The metallic line 315b can be substantially misaligned from the polysilicon line 315b_Poly along a direction substantially orthogonal to a surface 351 of the substrate 350. In some embodiments, the sequence of the metallic lines 315b and 317b can be different from the sequence of the polysilicon lines 315b_Poly and 317b_Poly.

Figure 4:
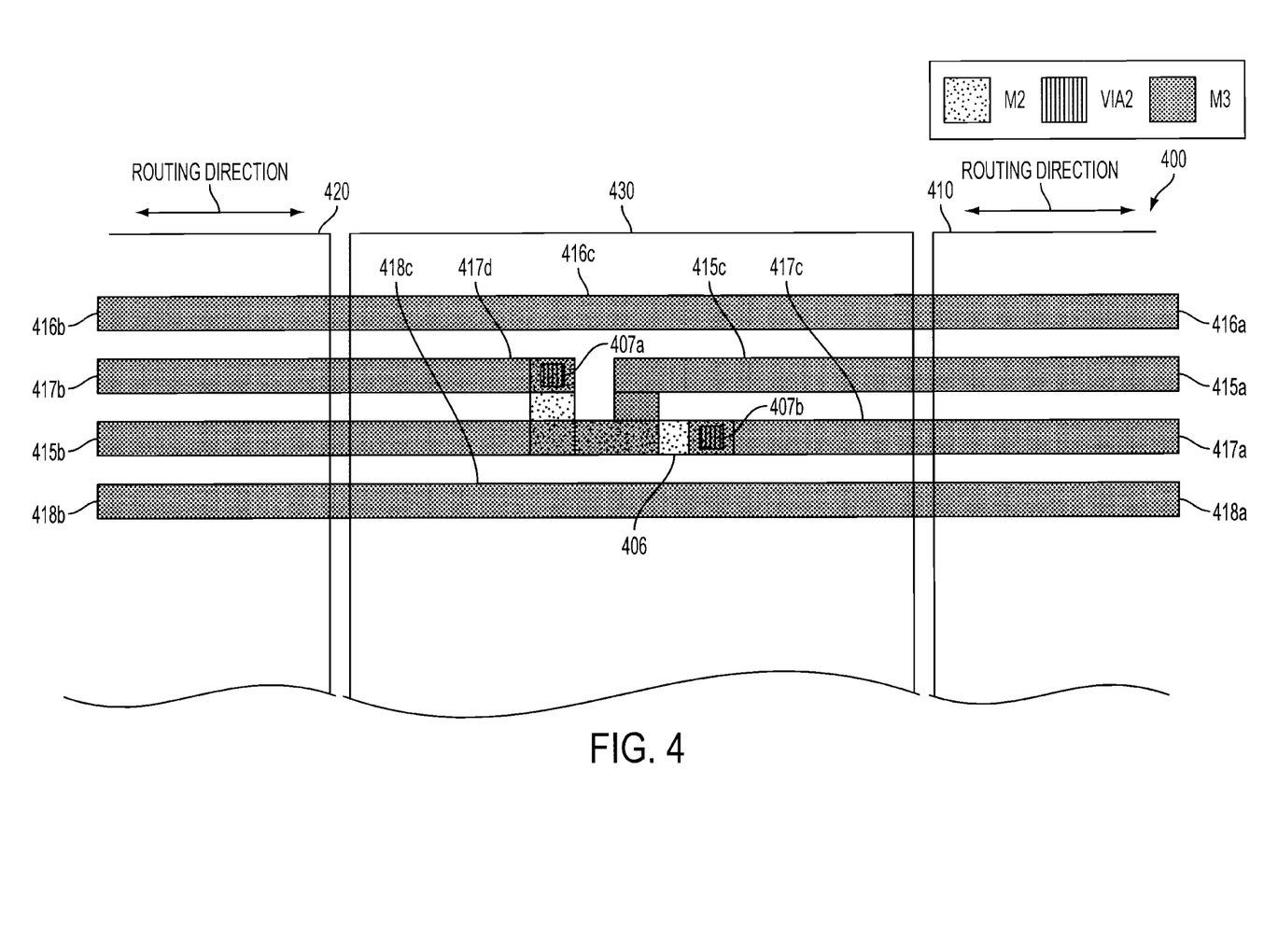
FIG. 4 is a schematic drawing illustrating various layers of an area of an exemplary memory circuit.

FIG. 4 is a schematic drawing illustrating various layers of an area of an exemplary memory circuit. FIG. 4 includes a metal 2 (M2) layer, a via 2 layer, and a metal 3 (M3) layer of an area of an exemplary memory circuit. Items of the memory array 400 in FIG. 4 that are the same items of the memory circuit 100 in FIG. 1 are indicated by the same reference numerals, increased by 300. The M2 layer, via 2 layer, and M3 layer can be similar to those described above in conjunction with FIGS. 2C and 3C.

Referring to FIG. 4, the area 430 can include a word line decoder, a word line driver, a strap area, a well-pickup area, and/or any area wherein the word line sequence is capable of being changed and/or at least one word line can jump over another word line. In the area 430, the M2 layer can include a metallic region 406. The via 2 layer can include via plugs 407a-407b. The M3 layer can include metallic lines 415c, 416c, 417c, 417d, and 418c. In the area 430, the metallic lines 415a, 416a, and 418a can be coupled with the metallic 415b, 416b, and 418b through the metallic lines 415c, 416c, and 418c, respectively. The metallic lines 416c and 418c can be straight lines. The metallic line 415c includes a couple of turns. With the turns, the metallic line 415a can be misaligned from the metallic line 415b in the routing direction of the metallic lines 415a. The metallic lines 417a and 417b can be coupled with the metallic lines 417c and 417d, respectively, in the area 430. The metallic line 417d can be coupled with the metallic line 417c through the via plugs 407a and 407b and the metallic region 406. In some embodiments, the metallic line 415c can be routed via or jump over the metallic region 406. In other embodiments, the word line including the metallic line 415c can jump over the word line including the metallic lines 417c, 417d and the metallic region 406.

It is noted that the well layer, oxide definition (OD) layer, poly layer, contact layer, via layers, and metal layers described above are mere examples. The memory arrays 210 and 320 and integrated circuit 400 described above in conjunction with FIGS. 2A-2D, 3A-3D, and 4 can include more layers such as a P-well layer, source/drain layer, lightly doped drain (LDD) layer, other contact layer, and/or other metal layer. It is noted that the description above regarding the metallic line 415c (M3 layer) jumping over the metallic region 406 (M2 layer) is merely exemplary. Different metal layers can be used for the routing and/or jumping the word lines. It is also noted that the layouts of the various layers shown in FIGS. 2A-2C, 3A-3C, and 4 are merely exemplary. One of skill in the art can modify the layouts of the layers of the memory circuit. The scope of the invention is not limited thereto.

Figure 5:
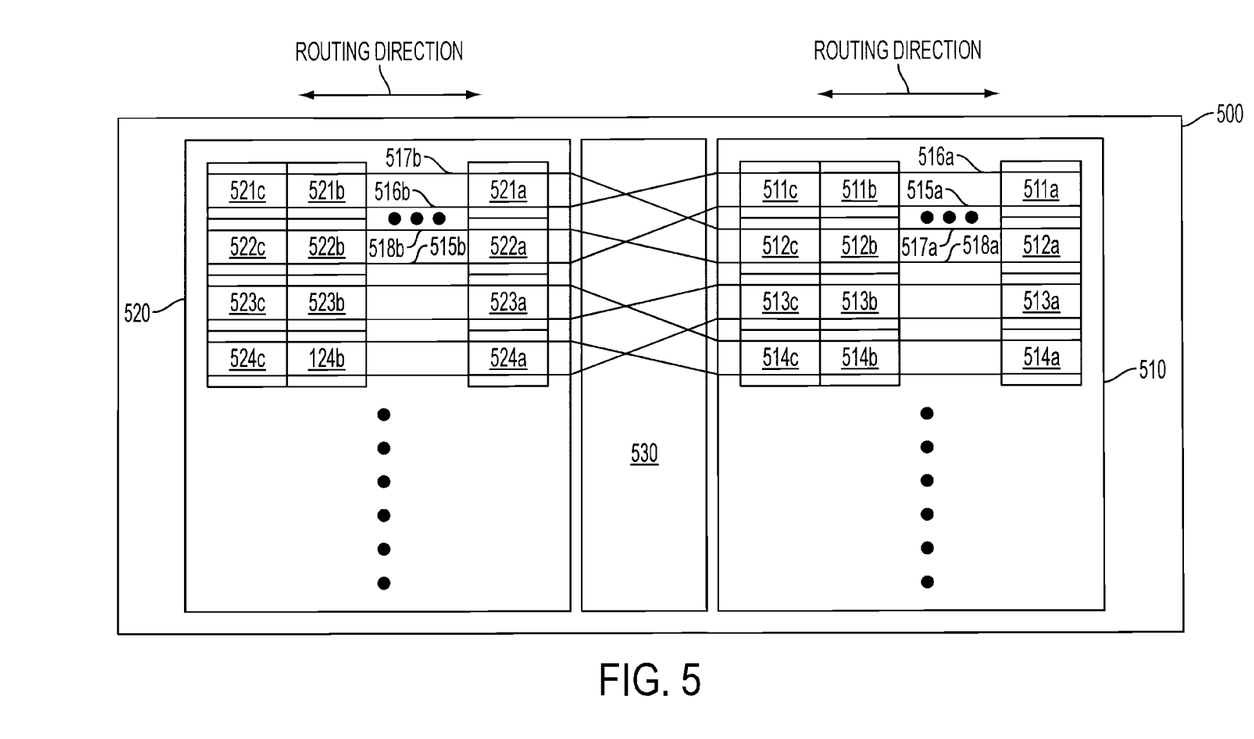
FIG. 5 is a schematic drawing illustrating another exemplary memory circuit having word line sequence exchanged.

FIG. 5 is a schematic drawing illustrating another exemplary memory circuit having word line sequence exchanged. In FIG. 5, word lines 515a-518a in a memory array 510 can be coupled with word lines 515b-518b in a memory array 520. Items of the memory array 500 in FIG. 5 that are the same items of the memory circuit 100 in FIG. 1 are indicated by the same reference numerals, increased by 400.

Referring to FIG. 5, the word lines 515a-518a in a memory array 510 can be misaligned from the word lines 515b-518b in a memory array 520 in the routing direction of the word lines 515a-518a and 515b-518b. In some embodiments, the sequence of the word lines 515a-518a in the memory array 510 can be word lines 516a, 515a, 517a, and 518a from the top. The sequence of word lines 515b-518b in the memory array 520 can be word lines 517b, 516b, 518b, and 515b from the top. The exchange of the sequence of the word lines 515a-518a and/or 515b-518b can be arranged within an area 530, such as a word line decoder, a word line driver, a strap area, a well-pickup area, and/or any area wherein the word line sequence is capable of being changed and/or at least one word line can jump over another word line. In some embodiments, the exchange of the word line sequence can be performed similar to that described above in conjunction with FIGS. 2A-2D, 3A-3D, and 4.

Figure 6:
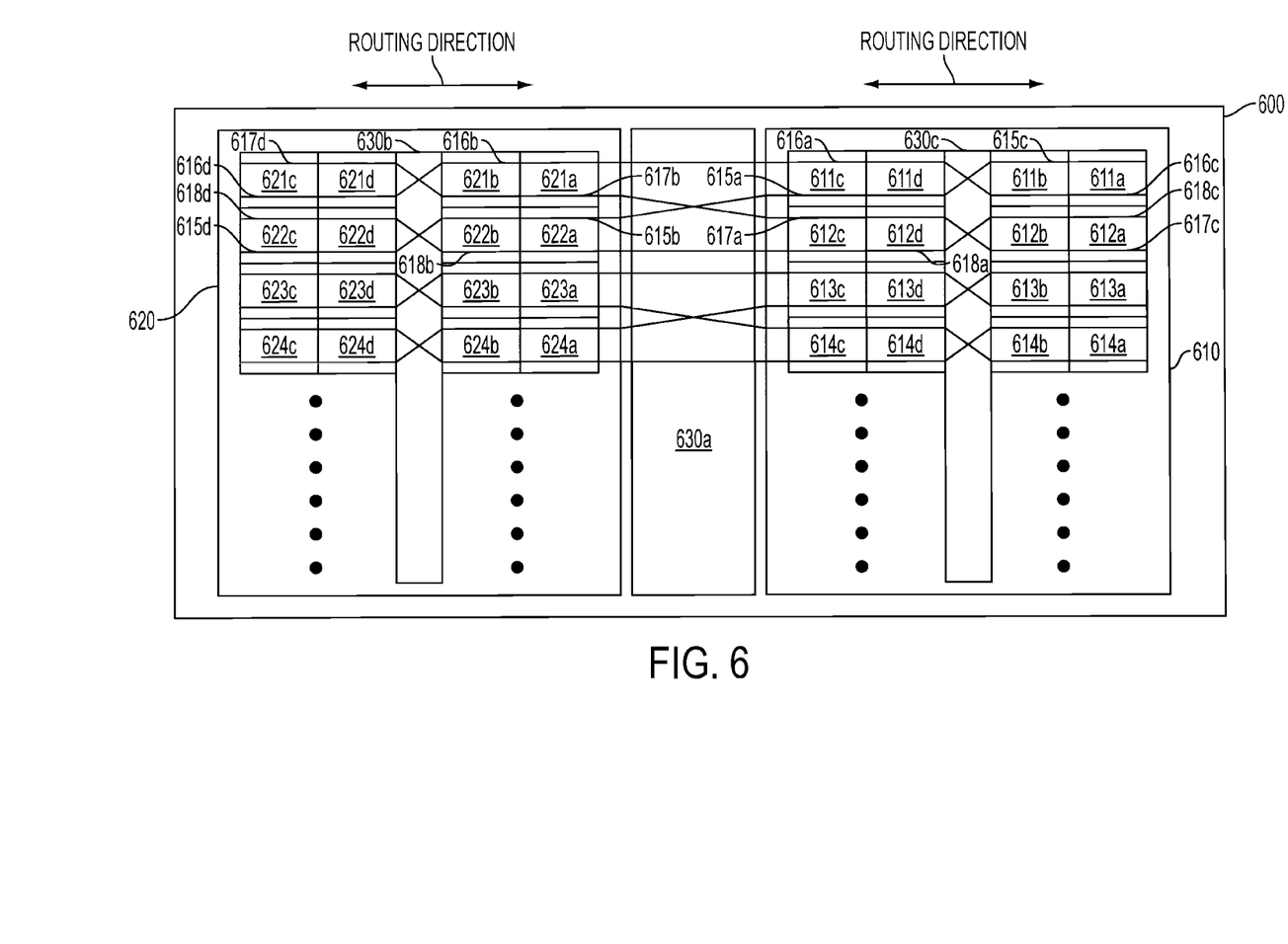
FIG. 6 is a schematic drawing illustrating an exemplary memory circuit having word line sequences exchanged in a decoder area and a strap area.

FIG. 6 is a schematic drawing illustrating an exemplary memory circuit having word line sequences exchanged in a decoder area and a strap area. In FIG. 6, a memory circuit 600 can include at least one memory array, e.g., memory arrays 610 and 620. The memory arrays 610 and 620 can include memory cells 611a-614c and 621a-624c, respectively. The memory circuit 600 can include a decoder area 630a and strap areas 630b-630c. The memory circuit 600 can include word lines 615a-615d coupled with each other. The memory circuit 600 can include word lines 616a-616d coupled with each other. The memory circuit 600 can include word lines 617a-617d coupled with each other. The memory circuit 600 can include word lines 618a-618d coupled with each other.

Referring to FIG. 6, the sequence of the word lines 615a-618a from the top in the memory array 610 can be the word lines 616a, 615a, 617a, and 618a. In one direction, the word line sequence can be exchanged in the strap area 630c. The sequence of the word lines 615c-618c from the top in the memory array 610 can be the word lines 615c, 616c, 618c, and 617c. In the other direction, the word line sequence can be exchanged in the decoder area 630a. The sequence of the word lines 615b-618b from the top in the memory array 620 can be the word lines 616b, 617b, 615b, and 618b. After exchanging the word line sequence in the strap area 630b, the sequence of the word lines 615d-618d from the top in the memory array 620 can be the word lines 617d, 616d, 618d, and 615d.

In some embodiments, the exchange of the word line sequence can be performed similar to that described above in conjunction with FIGS. 2A-2D, 3A-3D, and 4. It is noted that the exchange of the word line sequence described above in conjunction with FIGS. 1, 5, and 6 are merely exemplary. The scope of this application is not limited thereto.

Figure 7:
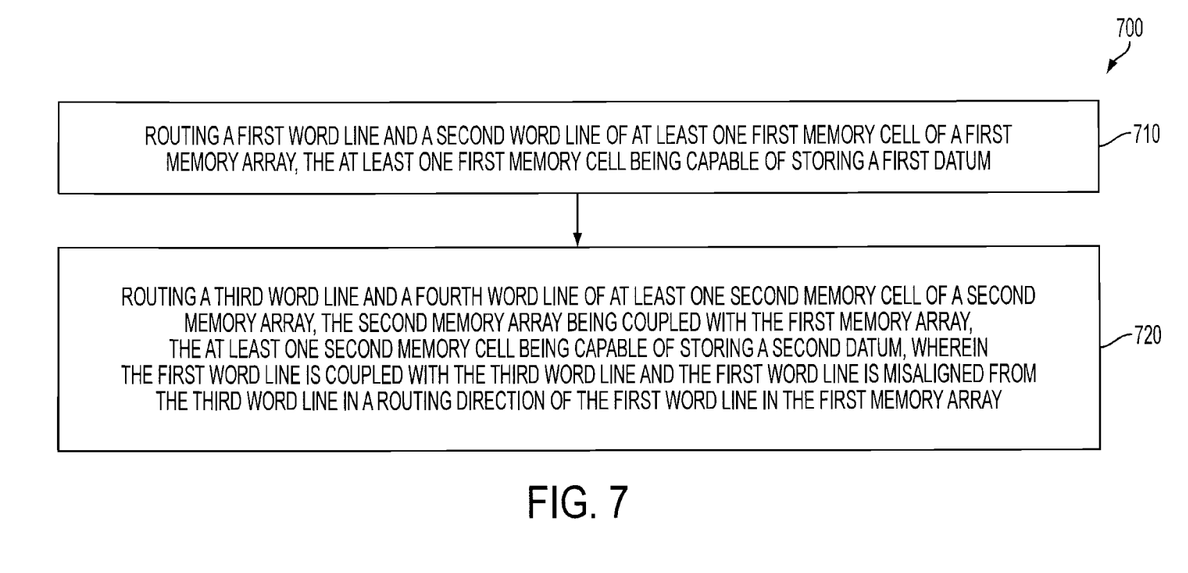
FIG. 7 is a flowchart illustrating an exemplary method for routing word lines of an exemplary memory circuit.

FIG. 7 is a flowchart illustrating an exemplary method for routing word lines of an exemplary memory circuit. In FIG. 7, a method 700 for routing word lines of a memory circuit can include a step 710 routing a first word line and a second word line and a step routing a third word line and a fourth word line.

Referring to FIGS. 1 and 7, the step 710 can route a first word line, e.g., the word line 115a, and a second word line, e.g., the word line 116a, of at least one first memory cell, e.g., the memory cells 111a-111c, of a first memory array, e.g., the memory array 110. The step 720 can route a third word line, e.g., the word line 115b, and a fourth word line, e.g., the word line 118b, of at least one second memory cell, e.g., the memory cells 122a-122c, of a second memory array, e.g., the memory array 120. The memory array 120 can be coupled with the memory array 110. The word line 115a is coupled with the word line 115b. The word line 115a is misaligned from the word line 115b in a routing direction of the word line 115a in the memory array 110.

In some embodiments, the word line 115a can be coupled with the word line 115b at the area 130 of the memory circuit 100. The area 130 includes a word line decoder, a word line driver, a strap area, a well-pickup area, and/or any area wherein the word line sequence is capable of being changed and/or at least one word line can jump over another word line.

Figure 8:
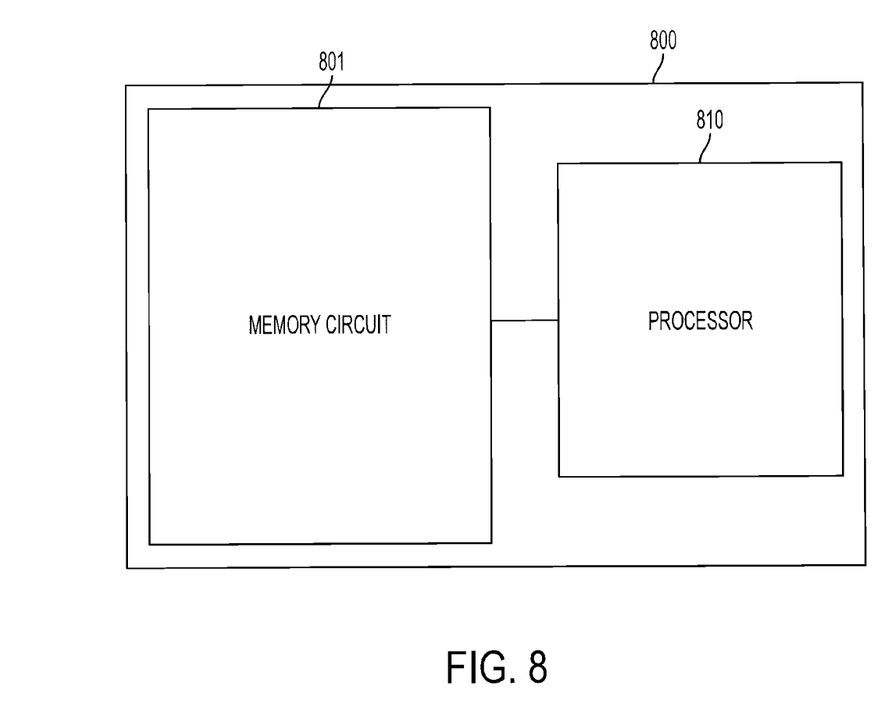
FIG. 8 is a schematic drawing showing a system including an exemplary memory circuit coupled with a processor.

FIG. 8 is a schematic drawing showing a system including an exemplary memory circuit coupled with a processor. In FIG. 8, a system 800 can include a processor 810 coupled with a memory circuit 801. The processor 810 is capable of accessing data stored in memory cells of the memory circuit 801. In some embodiments, the processor 810 can be a processing unit, central processing unit, digital signal processor, or other processor that is suitable for accessing data of memory circuit. The memory circuit 801 can be similar to the memory circuits 100, 500, and 600 described above in conjunction with FIGS. 1, 5, and 6, respectively.

In some embodiments, the processor 810 and the memory circuit 801 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 800 including the memory circuit 801 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a first memory array, the first memory array including at least one first memory cell for storing a first datum, the at least one first memory cell being coupled with a first word line and a second word line of the first memory array; and
a second memory array coupled with the first memory array, the second memory array including at least one second memory cell for storing a second datum, the at least one second memory cell being coupled with a third word line and a fourth word line of the second memory array,
wherein the first word line is coupled with the third word line and the first word line is misaligned from the third word line in a routing direction of the first word line in the first memory array, and the second word line and the fourth word line extend in parallel in a routing direction across the first memory array and the second memory array.

2. The memory circuit of claim 1, wherein the first word line comprises a polysilicon line and a metallic line, the metallic line is disposed over the polysilicon line, and the metallic line is misaligned from the polysilicon line in a direction perpendicular to a surface of a substrate over which the first word line is disposed.

3. The memory circuit of claim 1, wherein each of the at least one first memory cell and the at least one second memory cell is a dual port static random access memory (SRAM) cell.

4. The memory circuit of claim 1, wherein the first word line is coupled with the third word line at a first area of the memory circuit and the first area includes at least one of a word line decoder, a word line driver, a strap area, a well-pickup area, or any combinations thereof.

5. The memory circuit of claim 1, wherein the first memory array further comprises at least one third memory cell for storing a third datum, the at least one third memory cell being coupled with a fifth word line and a sixth word line, the fifth word line is coupled with the first word line, the sixth word line is coupled with the second word line, and the fifth word line is misaligned from the first word line in the routing direction of the first word line in the first memory array.

6. The memory circuit of claim 5, wherein the fifth word line is coupled with the first word line at a second area of the memory circuit and the second area includes at least one of a strap area, a well-pickup area, or any combinations thereof.

7. A system comprising:
a processor; and
a memory circuit coupled with the processor, the memory circuit comprising:
a first memory array, the first memory array including at least one first memory cell for storing a first datum, the at least one first memory cell being coupled with a first word line and a second word line of the first memory array; and
a second memory array coupled with the first memory array, the second memory array including at least one second memory cell for storing a second datum, the at least one second memory cell being coupled with a third word line and a fourth word line of the second memory array,
wherein the first word line is coupled with the third word line and the first word line is misaligned from the third word line in a routing direction of the first word line in the first memory array, and the second word line and the fourth word line extend in parallel in a routing direction across the first memory array and the second memory array.

8. The system of claim 7, wherein the first word line comprises a polysilicon line and a metallic line, the metallic line is disposed over the polysilicon line, and the metallic line is misaligned from the polysilicon line in a direction perpendicular to a surface of a substrate over which the first word line is disposed.

9. The system of claim 7, wherein each of the at least one first memory cell and the at least one second memory cell is a dual port static random access memory (SRAM) cell.

10. The system of claim 7, wherein the first word line is coupled with the third word line at a first area of the memory circuit and the first area includes at least one of a word line decoder, a word line driver, a strap area, a well-pickup area, or any combinations thereof.

11. The system of claim 7, wherein the first memory array further comprises at least one third memory cell for storing a third datum, the at least one third memory cell being coupled with a fifth word line and a sixth word line, the fifth word line is coupled with the first word line, the sixth word line is coupled with the second word line, and the fifth word line is misaligned from the first word line in the routing direction of the first word line in the first memory array.

12. The system of claim 11, wherein the fifth word line is coupled with the first word line at a second area of the memory circuit and the second area includes at least one of a strap area, a well-pickup area, or any combinations thereof.

13. A method for routing word lines of a memory circuit, the method comprising:
routing a first word line and a second word line of a first memory array, the first word line and the second word line coupled with at least one first memory cell of the first memory array, and the at least one first memory cell being capable of storing a first datum; and
routing a third word line and a fourth word line of a second memory array, the third word line and the fourth word line coupled with at least one second memory cell of the second memory array, and the second memory array being coupled with the first memory array, the at least one second memory cell being capable of storing a second datum,
wherein the first word line is coupled with the third word line and the first word line is misaligned from the third word line in a routing direction of the first word line in the first memory array, and the second word line and the fourth word line extend in parallel in a routing direction across the first memory array and the second memory array.

14. The method of claim 13, wherein the first word line comprises a polysilicon line and a metallic line, the metallic line is disposed over the polysilicon line, and the metallic line is misaligned from the polysilicon line in a direction perpendicular to a surface of a substrate over which the first word line is disposed.

15. The method of claim 13, wherein each of the at least one first memory cell and the at least one second memory cell is a dual port static random access memory (SRAM) cell.

16. The method of claim 13 further comprising:
coupling the first word line with the third word line at a first area of the memory circuit, wherein the first area includes at least one of a word line decoder, a word line driver, a strap area, a well-pickup area, or any combinations thereof.

17. The method of claim 13 further comprising:
routing a fifth word line and a sixth word line of at least one third memory cell of the first memory array, the at least one third memory cell being capable of storing a third datum, wherein the fifth word line is coupled with the first word line, the sixth word line is coupled with the second word line, and the fifth word line is misaligned from the first word line in the routing direction of the first word line in the first memory array.

18. The method of claim 17 further comprising:
coupling the fifth word line with the first word line at a second area of the memory circuit, wherein the second area includes at least one of a strap area, a well-pickup area or any combinations thereof.

* * * * *